(12) United States Patent
McLaurin et al.

(10) Patent No.: US 11,012,104 B2
(45) Date of Patent: May 18, 2021

(54) APPARATUS AND METHODS FOR CALIBRATING RADIO FREQUENCY TRANSMITTERS TO COMPENSATE FOR COMMON MODE LOCAL OSCILLATOR LEAKAGE

(71) Applicant: ANALOG DEVICES, INC., Norwood, MA (US)

(72) Inventors: David J. McLaurin, Raleigh, NC (US); Christopher Mayer, Dover, MA (US); Hatice Dicle Ozis Unsal, Raleigh, NC (US); Zheng Gao, Raleigh, NC (US)

(73) Assignee: Analog Devices, Inc., Norwood, MA (US)

( * ) Notice: Subject to any disclaimer, the term of this patent is extended or adjusted under 35 U.S.C. 154(b) by 530 days.

(21) Appl. No.: 15/478,926

(22) Filed: Apr. 4, 2017

(65) Prior Publication Data
US 2018/0254786 A1 Sep. 6, 2018

Related U.S. Application Data

(60) Provisional application No. 62/466,686, filed on Mar. 3, 2017.

(51) Int. Cl.
*H04B 1/04* (2006.01)
*H03D 7/16* (2006.01)

(52) U.S. Cl.
CPC ........... *H04B 1/0475* (2013.01); *H03D 7/165* (2013.01); *H03D 2200/009* (2013.01)

(58) Field of Classification Search
USPC .... 375/296, 297, 319, 221; 455/115.1, 67.1, 455/114.1
See application file for complete search history.

(56) References Cited

U.S. PATENT DOCUMENTS

| 4,662,001 A | 4/1987 | Cruz et al. |
| 5,613,233 A * | 3/1997 | Vagher ................. H03D 7/1433 330/258 |

(Continued)

FOREIGN PATENT DOCUMENTS

| CN | 101420236 A | 4/2009 |
| CN | 101540640 A | 9/2009 |

(Continued)

OTHER PUBLICATIONS

Anttila et al., "Joint Mitigation of Power Amplifier and I/Q Modulator Impairments in Broadband Direct-Conversion Transmitters" T-MTT Manuscript #7632 Final Version, 10 pages.

(Continued)

*Primary Examiner* — Wednel Cadeau
(74) *Attorney, Agent, or Firm* — Knobbe, Martens, Olson & Bear, LLP

(57) ABSTRACT

Apparatus and methods for calibrating radio frequency transmitters to compensate for common mode local oscillator leakage are provided herein. In certain configurations herein, a transmitter generates a radio frequency transmit signal based on mixing a baseband input signal with a local oscillator signal. The transmitter is calibrated to compensate for common mode local oscillator leakage. Thus, a common mode component of the local oscillator signal is reduced or eliminated from the radio frequency transmit signal, which provides a number of benefits, including lower levels of undesired emissions from the transmitter.

20 Claims, 10 Drawing Sheets

(56) References Cited

U.S. PATENT DOCUMENTS

| | | |
|---|---|---|
| 6,704,551 B2 | 3/2004 | Riou et al. |
| 6,960,962 B2 | 11/2005 | Peterzell et al. |
| 6,973,297 B1 | 12/2005 | Manku et al. |
| 7,280,805 B2 | 10/2007 | Xu et al. |
| 7,440,732 B2 | 10/2008 | Pan |
| 7,536,165 B2 | 5/2009 | Redman-White |
| 7,755,448 B2 | 7/2010 | Zolomy et al. |
| 8,120,428 B2 | 2/2012 | Montalvo et al. |
| 8,594,583 B2 | 11/2013 | Montalvo et al. |
| 8,718,577 B1 | 5/2014 | Smidth |
| 8,744,385 B2 | 6/2014 | Yahav et al. |
| 8,824,980 B2 | 9/2014 | Mclaurin |
| 8,884,802 B2 | 11/2014 | Li et al. |
| 8,913,694 B2 | 12/2014 | Al-qaq et al. |
| 8,934,856 B2 | 1/2015 | Mclaurin et al. |
| 9,048,847 B2 | 6/2015 | Mclaurin et al. |
| 9,300,444 B2 | 3/2016 | Hormis et al. |
| 9,614,557 B1 | 4/2017 | Mayer et al. |
| 9,673,847 B1 | 6/2017 | Mayer et al. |
| 2002/0048326 A1* | 4/2002 | Sahlman .............. H03F 1/3229 375/297 |
| 2002/0163391 A1 | 11/2002 | Peterzell |
| 2002/0186106 A1* | 12/2002 | Miller .................... H01L 23/48 333/247 |
| 2004/0017862 A1* | 1/2004 | Redman-White .... H03D 7/1425 375/319 |
| 2006/0068746 A1 | 3/2006 | Feng et al. |
| 2007/0123182 A1 | 5/2007 | Dekker |
| 2008/0174383 A1 | 7/2008 | Zolomy et al. |
| 2009/0068963 A1 | 3/2009 | Cabanillas et al. |
| 2012/0299651 A1 | 11/2012 | Goel et al. |
| 2014/0184301 A1 | 7/2014 | Ro |
| 2014/0269863 A1 | 9/2014 | Fan et al. |
| 2016/0173317 A1* | 6/2016 | Bitton .................. H04L 27/364 455/114.2 |
| 2016/0356868 A1 | 12/2016 | Stormont et al. |

FOREIGN PATENT DOCUMENTS

| | | |
|---|---|---|
| CN | 103916345 A | 7/2014 |
| CN | 105577594 A | 5/2016 |
| KR | 100737747 B1 | 7/2007 |
| TW | 201001940 A | 1/2010 |
| WO | WO 2017/080492 A1 | 5/2017 |

OTHER PUBLICATIONS

Jayasuriya et al., "A Baseband Technique for Automated LO Leakage Suppression Achieving <−80dBm in Wideband Passive Mixer-First Receivers" IEEE, 2014, 4 pages.

Lanschutzer et al., "Integrated Adaptive LO Leakage Cancellation for W-CDMA Direct Upconversion Transmitters" 2003 IEEE Radio Frequency Integrated Circuits Symposium, 4 pages.

Office Action Issued for Chinese Application No. 201810178478.1 dated Jun. 3, 2020 in 8 pages.

* cited by examiner

APPARATUS AND METHODS FOR CALIBRATING RADIO FREQUENCY TRANSMITTERS TO COMPENSATE FOR COMMON MODE LOCAL OSCILLATOR LEAKAGE

CROSS-REFERENCE TO RELATED APPLICATIONS

The present application claims priority to U.S. Provisional Patent Application No. 62/466,686, filed Mar. 3, 2017, and titled "APPARATUS AND METHODS FOR CALIBRATING RADIO FREQUENCY TRANSMITTERS TO COMPENSATE FOR COMMON MODE LOCAL OSCILLATOR LEAKAGE," the entirety of which is hereby incorporated herein by reference.

FIELD OF THE DISCLOSURE

Embodiments of the invention relate to electronic systems, and more particularly, to calibration of radio frequency transmitters.

BACKGROUND

Transceivers are used in radio frequency (RF) communication systems to transmit and receive signals associated with a wide variety of communication technologies, such as cellular and/or wireless local area network (WLAN) technologies.

Examples of RF communication systems with one or more transceivers include, but are not limited to, base stations, mobile devices (for instance, smartphones or handsets), laptop computers, tablets, and wearable electronics.

A transceiver includes a transmitter for transmitting RF signals and a receiver for receiving RF signals. To improve the transceiver's performance, the transceiver can be calibrated to compensate for impairments. Calibrating the transceiver in this manner can decrease error vector magnitude (EVM), reduce out of band emissions, and/or otherwise enhance the performance of the transceiver.

SUMMARY OF THE DISCLOSURE

Apparatus and methods for calibrating radio frequency (RF) transmitters to compensate for common mode local oscillator (LO) leakage are provided herein. In certain configurations herein, a transmitter generates an RF transmit signal based on mixing a baseband input signal with an LO signal. The transmitter is calibrated to compensate for common mode LO leakage. Thus, a common mode component of the LO signal is reduced or eliminated from the RF transmit signal, which provides a number of benefits, including lower levels of undesired emissions from the transmitter.

In one aspect, a communication system with common mode LO leakage compensation is provided. The RF communication system includes an RF transmitter including an LO and configured to generate a transmitter output signal, an LO leakage observation circuit configured to observe an amount of common mode LO leakage from the LO in the transmitter output signal, and a common mode LO generation circuit configured to compensate the RF transmitter for the amount of common mode LO leakage observed by the LO leakage observation circuit.

In another aspect, a method of compensating for transmitter common mode LO leakage in an RF communication system is provided. The method includes generating a transmitter output signal using an RF transmitter that includes an LO, observing an amount of common mode LO leakage from the LO present in the transmitter output signal using an LO leakage observation circuit; and compensating the RF transmitter for common mode LO leakage based on the observed amount of common mode LO leakage using a common mode LO generation circuit.

In another aspect, a transceiver die with common mode LO leakage compensation is provided. The transceiver die includes a semiconductor substrate, and an RF transmitter formed on the semiconductor substrate. The RF transmitter includes an LO, and is configured to generate a transmitter output signal. The transceiver die further includes an LO leakage observation circuit formed on the semiconductor substrate and configured to observe an amount of common mode LO leakage from the LO in the transmitter output signal. The transceiver die further includes a common mode LO generation circuit formed on the semiconductor substrate and configured to compensate the RF transmitter for the amount of common mode LO leakage observed by the LO leakage observation circuit.

DETAILED DESCRIPTION OF EMBODIMENTS

Figure 1:
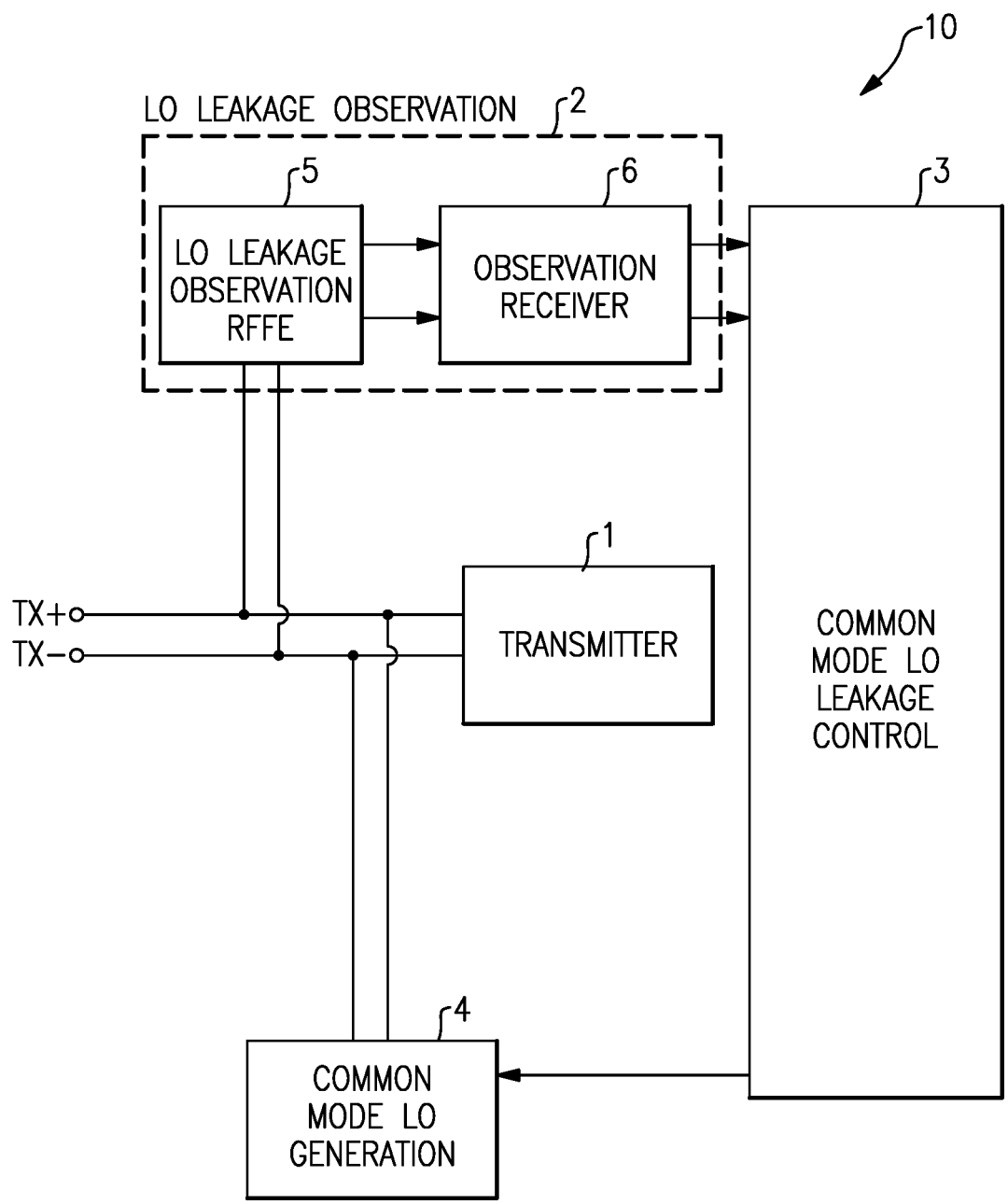
FIG. 1 is a schematic diagram of one embodiment of a radio frequency (RF) communication system.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A transceiver, such as a direct conversion quadrature radio, can suffer from a variety of impairments. Absent calibration, the impairments can lead to performance degradation.

In one example, a direct conversion quadrature radio includes a zero-intermediate frequency (zero-IF) transmitter used for transmitting radio frequency signals. The zero-IF transmitter upconverts a baseband signal using a local oscillator (LO) frequency that is at or near a carrier frequency. Although zero-IF transmitters can have significant power and costs advantages relative to IF and super heterodyne transmitters, zero-IF transmitters suffer from impairments that limit in-band undesired emission performance.

One such transmitter impairment is LO leakage, in which a portion of an LO signal used for mixing appears at the transmitter's output. LO leakage can arise from finite isolation between an LO port of a mixer and a signal port of the mixer. Absent correction or calibration, the LO leakage can lead to failure of tests monitoring for undesired emissions.

For example, undesired DC offsets in the transmitter's baseband can mix with the LO signal, thereby generating LO power at the transmitter's output. The LO leakage can be present at frequencies having specified limits on undesired emissions from the transmitter. Thus, LO leakage can limit transmitter performance in applications having relatively stringent emissions specifications. For example, certain zero-IF transmitters support non-contiguous carrier aggregation, in which the LO frequency may not be inside a desired frequency channel. In such implementations, the emissions limits can be relatively strict, for instance, a limitation of emissions to about −70 dBc or smaller.

To reduce or limit such undesired emissions, the transmitter can be calibrated to reduce the level of LO leakage.

A transmitter can include a non-inverted voltage output $V_{tx\_p}$ and an inverted voltage output $V_{tx\_n}$ for providing a transmitter output signal. Additionally, the transmitter output signal has a differential component about equal to $(V_{tx\_p} - V_{tx\_n})$ and a common mode component about equal to $(V_{tx\_p} + V_{tx\_n})/2$. Differential LO leakage can impact the differential component of the transmitter output signal, and common mode LO leakage can impact the common mode component of the transmitter output signal.

Although certain compensation schemes correct for differential LO leakage, the inventors have recognized that a common mode LO leakage component can also degrade the performance of a transmitter, such as a zero-IF transmitter.

For example, a balun can be included to convert a differential output signal of a transmitter to a single-ended signal suitable for amplification by a power amplifier (PA) and subsequent transmission via an antenna. Ideally the balun rejects a common mode component of LO leakage present in the transmitter's differential output signal. However, finite common mode rejection ratio (CMRR) of the balun can result in a portion of the common mode LO leakage nevertheless reaching the balun's output.

In contrast, the CMRR of a typical observation receiver used for observing and calibrating a transmitter is relatively high, such that the observation receiver does not observe common mode LO leakage. Even in implementations in which the observation receiver's CMRR is finite, the CMRR of the observation receiver and the CMRR of the balun may not match. Thus, such observation receivers are unsuitable for estimating the amount of common mode LO leakage and for compensating the same.

Apparatus and methods for calibrating RF transmitters to compensate for common mode LO leakage are provided herein. In certain configurations, an RF communication system includes an RF transmitter, an LO leakage observation circuit that detects a common mode LO leakage present in a transmitter output signal of the RF transmitter, and a common mode LO generation circuit that compensates the RF transmitter for the detected amount of common mode LO leakage. For example, the common mode LO generation circuit can generate a common mode LO signal that is combined with the transmitter output signal to compensate for common mode LO leakage.

In certain implementations, the common mode LO generation circuit is controlled by a common mode LO leakage control circuit that selects or chooses an appropriate correction level or setting of the common mode LO generation circuit based on the observed amount of common mode LO leakage.

In certain implementations, the LO leakage observation circuit is also used to detect and compensate for differential LO leakage. For instance, the baseband in-phase (I) and baseband quadrature-phase (Q) paths of the RF transmitter can include digital adders used for adding an appropriate DC offset to the I and Q paths of the RF transmitter, thereby compensating for differential LO leakage.

Accordingly, in certain implementations, the LO leakage observation circuit is used to calibrate not only common mode LO leakage, but also differential LO leakage. Using a common or shared circuit for both functions enhances integration of the RF communication system.

In one example, the observation receiver includes an LO leakage observation radio frequency front end (RFFE) that is configurable to detect either common mode LO leakage or differential LO leakage. By using configurable circuitry to observe both common mode and differential LO leakage, a shared LO leakage observation path can be used to measure a totality of a transmitter's LO leakage. By calibrating the RF transmitter in this manner, low levels of LO leakage can be achieved.

FIG. 1 is a schematic diagram of one embodiment of an RF communication system 10. The RF communication system 10 includes an RF transmitter 1, an LO leakage observation circuit 2, a common mode LO leakage control circuit 3, and a common mode LO generation circuit 4.

Although not illustrated in FIG. 1, the RF communication system 10 can include additional circuitry and/or other structures that have been omitted for clarity of the figures.

As shown in FIG. 1, the RF transmitter 1 generates a transmitter output signal on a non-inverted transmitter output TX+ and an inverted transmitter output TX−. The transmitter output signal includes a common mode component and a differential component.

The RF transmitter 1 includes one or more local oscillators that can generate LO leakage of the RF transmitter 1. The LO leakage can arise from finite isolation between an LO port of a mixer and a signal port of the mixer. Absent calibration, the LO leakage can lead to the RF communication system 10 failing undesired emissions tests.

The LO leakage observation circuit 2 detects a common mode LO leakage present in the transmitter output signal. Additionally, the common mode LO leakage control circuit 3 processes one or more observation signals indicating the detected amount of common mode LO leakage to control an amount of common mode LO leakage correction provided by the common mode LO generation circuit 4. Thus, the common mode LO generation circuit 4 compensates the RF transmitter 1 for the detected amount of common mode LO leakage.

In the illustrated embodiment, the common mode LO generation circuit 4 generates a common mode LO signal that is combined with the transmitter output signal to compensate for common mode LO leakage. Thus, the signal present at the non-inverted transmitter output TX+ and the inverted transmitter output TX− is compensated for common mode LO leakage. In one embodiment, the non-inverted transmitter output TX+ and the inverted transmitter output TX− correspond to output pins or pads of a semiconductor die or chip.

In the illustrated embodiment, the LO leakage observation circuit 2 includes an LO leakage observation RFFE 5 and an observation receiver 6. The LO leakage observation RFFE 5 is used to detect a common mode LO leakage present in the transmitter output signal. Additionally, the LO leakage observation RFFE 5 generates a leakage detection signal indicating the amount of common mode LO leakage, and the observation receiver 6 downconverts the leakage detection signal to baseband or a suitable intermediate frequency for processing by the common mode LO leakage control circuit 3. Although one example of an LO leakage observation circuit is shown in FIG. 1, the teachings herein are applicable to LO leakage observation circuits implemented in a wide variety of ways.

In certain implementations, the observation receiver 6 provides the common mode LO leakage control circuit 3 with one or more digital observation signals indicating the amount of common mode LO leakage. Additionally, the common mode LO leakage control circuit 3 can include digital circuitry (for instance, digital logic gates) that processes the digital observation signals to control the amount of common mode LO leakage correction provided by the common mode LO generation circuit 4. However, other implementations are possible.

In one embodiment, the LO leakage observation circuit 2 is also used to detect for differential LO leakage. Accordingly, in certain implementations, the LO leakage observation circuit 2 is used to not only for calibration of common mode LO leakage, but also for calibration of differential LO leakage. Using a common or shared circuit for both functions enhances integration of the RF communication system 10.

In certain implementations, the LO leakage observation RFFE 5 is configurable to detect either common mode LO leakage or differential LO leakage. By using configurable circuitry to observe both common mode and differential LO leakage, a shared LO leakage observation path can be used to measure a totality of the RF transmitter's LO leakage. In one example, the common mode LO leakage control circuit 3 generates one or more control signal operable to control a type or mode of observation of the LO leakage observation RFFE 5.

In one embodiment, the RF communication system 10 of FIG. 1 is fabricated on a common integrated circuit (IC) or semiconductor die. Implementing the RF communication system 10 in this manner enhances integration, and can provide on-chip compensation for common-mode LO leakage. However, other implementations are possible. For example, in another embodiment, the common mode LO leakage control circuit 3 is off-chip, and is implemented to send and receive digital signals via a serial interface.

Figure 2:
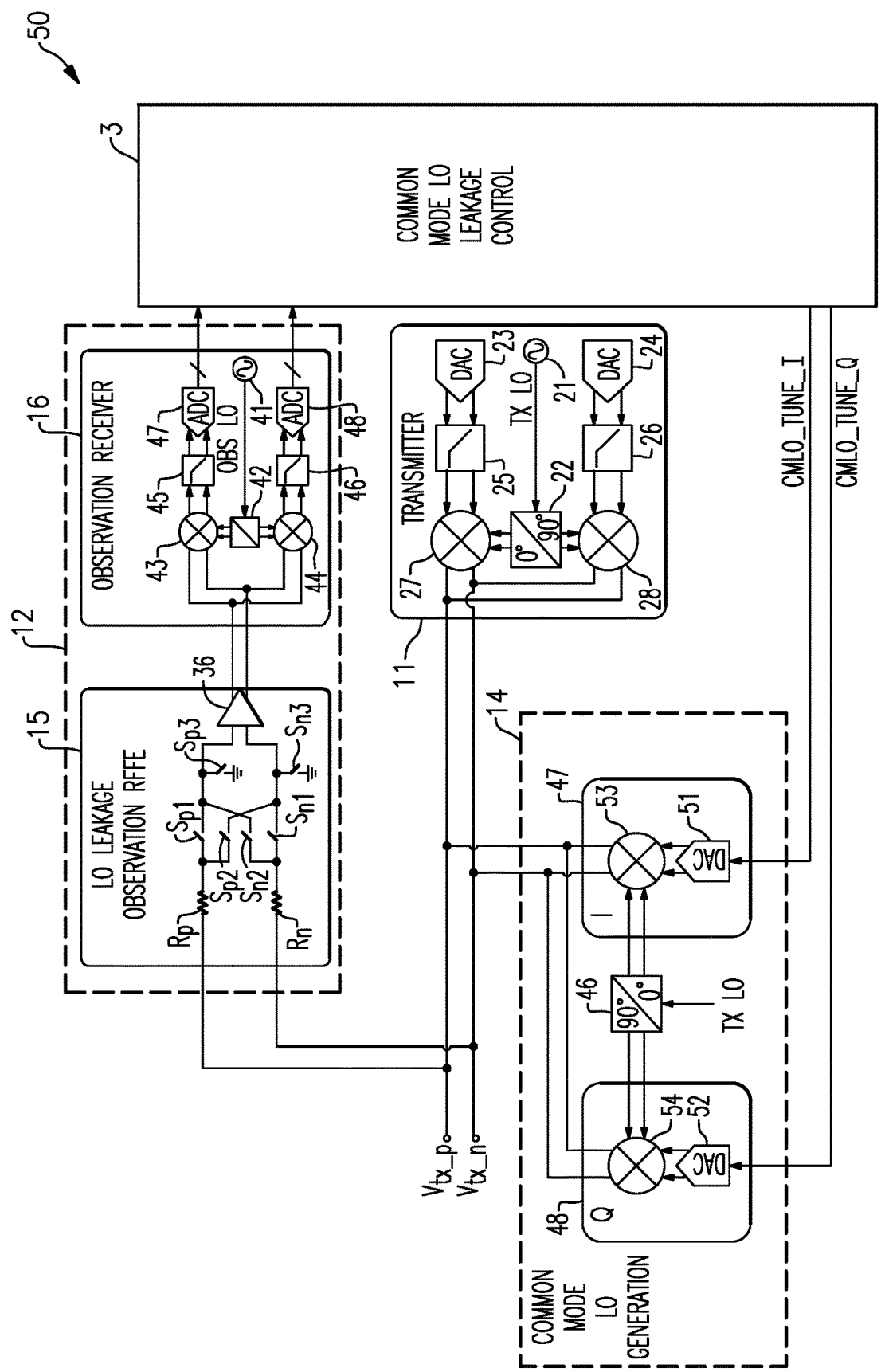
FIG. 2 is a schematic diagram of another embodiment of an RF communication system.

FIG. 2 is a schematic diagram of another embodiment of an RF communication system 50. The RF communication system 50 includes an RF transmitter 11, an LO leakage observation circuit 12, a common mode LO leakage control circuit 3, and a common mode LO generation circuit 14.

As shown in FIG. 2, the RF transmitter 11 generates a transmitter output signal on a non-inverted voltage output $V_{tx\_p}$ and an inverted voltage output $V_{tx\_n}$. The transmitter output signal includes a common mode component and a differential component.

In the illustrated embodiment, the RF transmitter 11 includes a transmit LO 21, a quadrature clock signal generator 22, an I-path digital-to-analog converter (DAC) 23, a Q-path DAC 24, an I-path filter 25, a Q-path filter 26, an I-path mixer 27, and a Q-path mixer 28. As shown in FIG. 2, the transmit LO 21 generates a transmit local oscillator signal (TX LO), which is used to generate quadrature clock signals used for providing frequency upconversion via the I-path mixer 27 and the Q-path mixer 28. Although one example implementation of an RF transmitter is shown in FIG. 2, the teachings herein are applicable to RF transmitters implemented in a wide variety of ways.

LO leakage from the transmit LO 21 can degrade the signal quality of the transmitter output signal. For example, finite isolation between the LO ports and signal ports of the I-path mixer 27 and the Q-path mixer 28 can lead to LO leakage. Absent correction or calibration, the LO leakage can lead to failure of tests monitoring for undesired emissions.

In the illustrated embodiment, the observation path through the LO leakage observation circuit 12 includes an LO leakage observation RFFE 15 and an observation receiver 16. Additionally, the LO leakage observation RFFE 15 is configurable to detect either common mode or differential LO leakage. This advantageously allows the observation path to observe both common mode and differential LO leakage, thereby measuring a totality of LO leakage of the RF transmitter 11.

For example, the illustrated LO leakage observation RFFE 15 includes a resistor $R_p$, a resistor $R_n$, a switch $S_{p1}$, a switch $S_{p2}$, a switch $S_{p3}$, a switch $S_{n1}$, a switch $S_{n2}$, a switch $S_{n3}$, and an amplification circuit 36, which can have any suitable gain (including, but not limited to, unity gain). As will be described in detail further below with reference to FIGS. 3A-3D, a state of the switches can be controlled to configure the RFFE 15 for common mode or differential LO leakage observations. Although one example of an LO leakage observation RFFE is shown in FIG. 2, LO leakage can be observed in other ways.

With continuing reference to FIG. 2, the observation receiver 16 includes an observation LO 41, a quadrature clock signal generator 42, an I-path mixer 43, a Q-path mixer 44, an I-path filter 45, a Q-path filter 46, an analog-to-digital converter (ADC) 47, and a Q-path ADC 48. As shown in FIG. 2, the observation LO 41 generates an observation local oscillator signal (OBS LO), which is used for generating quadrature clock signals that provide frequency downconversion via the I-path mixer 43 and the Q-path mixer 44. The observation receiver 16 processes the leakage detection signal from the LO leakage observation RFFE 15 to generate an I-path digital observation signal and a Q-path digital observation signal for the common mode LO leakage control circuit 3. Although one example implementation of an observation receiver is shown in FIG. 2, the teachings herein are applicable to configurations using observation receivers implemented in other ways as well as to configurations without observation receivers.

In the illustrated embodiment, the common mode LO generation circuit 14 includes a quadrature clock signal generator 46, an I compensation circuit 47, and a Q compensation circuit 48. The I compensation circuit 47 includes a first DAC 51 and an I mixer 53, and the Q compensation circuit 48 includes a second DAC 52 and a Q mixer 54. The quadrature clock signal generator 46 receives the transmit local oscillator signal (TX LO), and generates quadrature clock signals for the I mixer 53 and Q mixer 54. Thus, the I mixer 53 and the Q mixer 54 operate using the same local oscillator signal as the RF transmitter 11, in this embodiment.

As shown in FIG. 2, the I mixer 53 is controlled by the first DAC 51, and the Q mixer 54 is controlled by the second DAC 52. Additionally, the common mode LO leakage control circuit 3 generates a first digital control signal CMLO_TUNE_I that controls an amount of common mode leakage compensation provided by the I mixer 53. Furthermore, the common mode LO leakage control circuit 3 generates a second digital control signal CMLO_TUNE_Q that controls an amount of common mode leakage compensation provided by the Q mixer 54. In certain implementations, the first DAC 51 and the second DAC 52 are relatively low-speed/low-cost DACs, and a bandwidth of the digital control signals is relatively low.

In certain implementations, the common mode LO leakage control circuit 3 controls a value of the first digital control signal CMLO_TUNE_I to compensate for common mode LO leakage arising from the I-path mixer 27 of the RF transmitter 11, and a value of the second digital control signal CMLO_TUNE_Q to compensate for common mode LO leakage arising from the Q-path mixer 28 of the RF transmitter 11.

Although one embodiment of a common mode LO generation circuit is shown in FIG. 2, the teachings herein are applicable to common mode LO generation circuits implemented in a wide variety of ways.

FIGS. 3A-3D illustrate various observation modes of the LO leakage observation RFFE 15 of FIG. 2.

The LO leakage observation RFFE 15 includes a resistor $R_p$, a resistor $R_n$, a switch $S_{p1}$, a switch $S_{p2}$, a switch $S_{p3}$, a switch $S_{n1}$, a switch $S_{n2}$, a switch $S_{n3}$, and an amplification circuit 36.

Figure 3A:
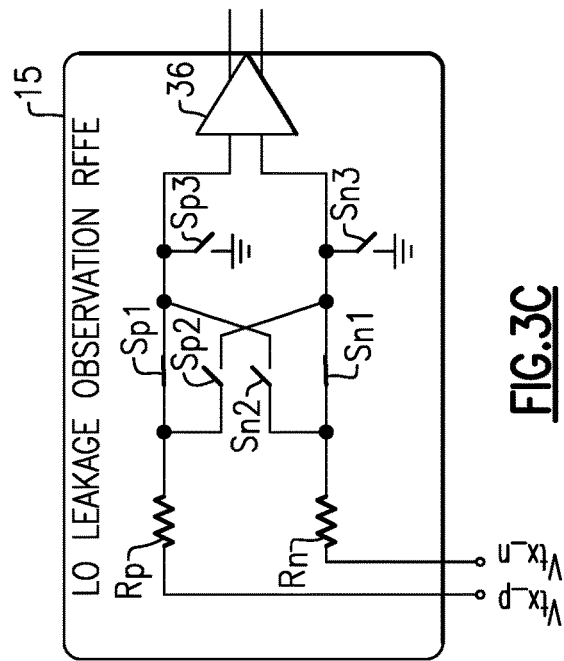
FIG. 3A illustrates one example of an observation mode of a local oscillator (LO) leakage observation radio frequency front end (RFFE) according to one embodiment.

FIG. 3A illustrates one observation mode or configuration of the RFFE 15 for measuring common mode LO leakage. As shown in FIG. 3A, the switches $S_{p1}$, $S_{n2}$, and $S_{n3}$ are closed or turned on, and switches $S_{p2}$, $S_{p3}$, and $S_{n1}$ are opened or turned off. Thus, a first input of the amplification circuit 36 is connected to $V_{tx\_p}$ via switch $S_{p1}$ and resistor $R_p$, and to $V_{tx\_n}$ via switch $S_{n2}$ and resistor $R_n$. When resistor $R_p$ and resistor $R_n$ are of about equal value, the voltage of the amplification circuit's first input is about equal to $(V_{tx\_p}+V_{tx\_n})/2$, which is the common mode component of the transmitter output signal. Additionally, a second input of the amplification circuit 36 is connected to a reference voltage (for instance, ground or AC ground) such that the differential input signal to the amplification circuit 36 is about equal to the common mode component of the transmitter output signal, or $(V_{tx\_p}+V_{tx\_n})/2$.

Figure 3C:
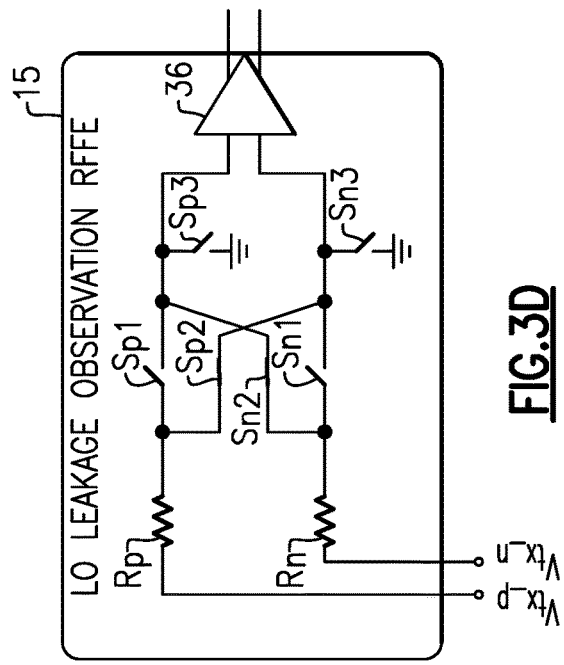
FIG. 3C illustrates another example of an observation mode of the LO leakage observation RFFE of FIG. 3A.
Figure 3B:
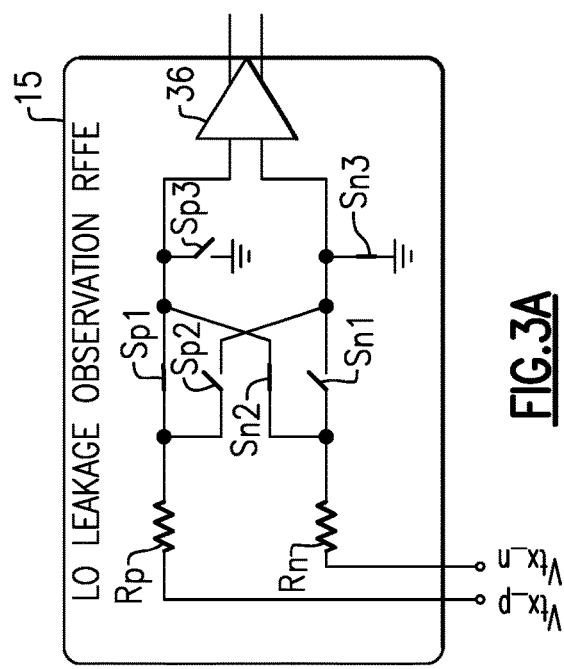
FIG. 3B illustrates another example of an observation mode of the LO leakage observation RFFE of FIG. 3A.

FIG. 3B illustrates another observation mode of the RFFE 15 for measuring common mode LO leakage. As shown in FIG. 3B, the switches $S_{p2}$, $S_{p3}$, and $S_{n1}$ are closed, and the switches $S_{p1}$, $S_{n2}$, and $S_{n3}$ are opened. The configuration shown in FIG. 3B measures an inverted version of the common mode component of the transmitter output signal, or $-(V_{tx\_p}+V_{tx\_n})/2$.

FIG. 3C illustrates an observation mode or configuration of the RFFE 15 for measuring differential LO leakage. As shown in FIG. 3C, the switches $S_{p1}$ and $S_{n1}$ are closed, and the switches $S_{p2}$, $S_{p3}$, $S_{n2}$, and $S_{n3}$ are opened. In this configuration, the first input of the amplification circuit 36 is connected to $V_{tx\_p}$ via switch $S_{p1}$ and resistor $R_p$, and the second input of the amplification circuit 36 is connected to $V_{tx\_n}$ via switch $S_{n1}$ and resistor $R_n$. The differential input voltage to the amplification circuit 36 is thus about equal to $(V_{tx\_p}-V_{tx\_n})$, which is the differential transmitter output signal.

Figure 3D:
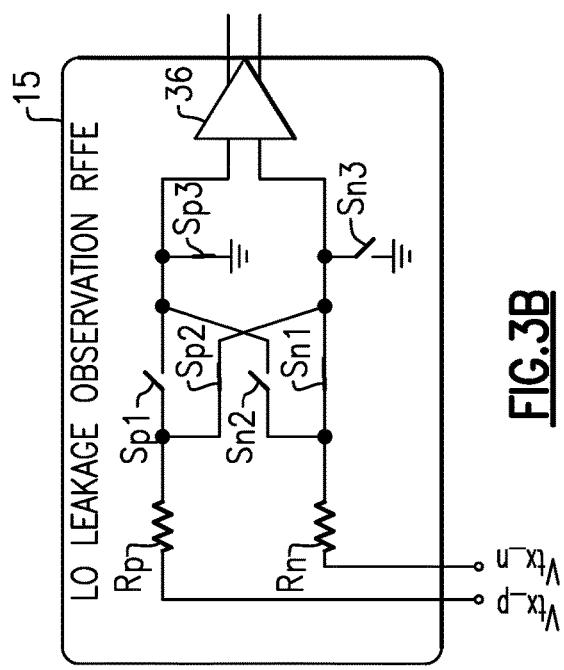
FIG. 3D illustrates another example of an observation mode of the LO leakage observation RFFE of FIG. 3A.

FIG. 3D illustrates another observation mode of the RFFE 15 for measuring differential LO leakage. As shown in FIG. 3D, the switches $S_{p2}$ and $S_{n2}$ are closed, and the switches $S_{p1}$, $S_{p3}$, $S_{n1}$, and $S_{n3}$ are opened. The configuration shown in FIG. 3D measures an inverted version of the differential transmitter output signal, or $-(V_{tx\_p}-V_{tx\_n})$.

One example of switch state versus mode for the RFFE 15 is shown in Table 1 below.

TABLE 1

| Observation Mode | $S_{p1}$ | $S_{p2}$ | $S_{p3}$ | $S_{n1}$ | $S_{n2}$ | $S_{n3}$ |
|---|---|---|---|---|---|---|
| common mode LO leakage, non-inverted | On | Off | Off | Off | On | On |
| common mode LO leakage, inverted | Off | On | On | On | Off | Off |
| differential LO leakage, non-inverted | On | Off | Off | On | Off | Off |
| differential LO leakage, inverted | Off | On | Off | Off | On | Off |

Figure 4:
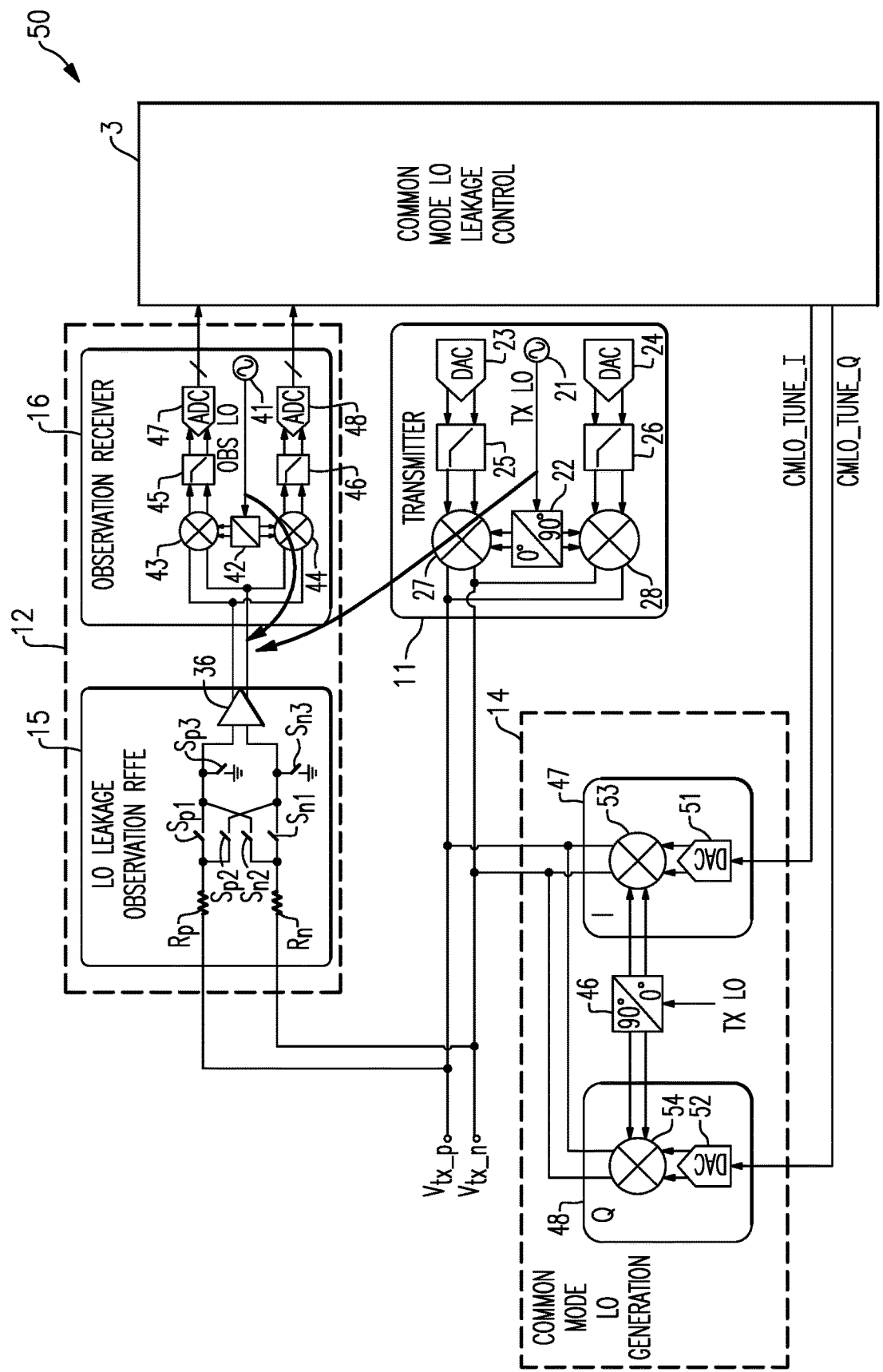
FIG. 4 is an annotated schematic diagram of the RF communication system of FIG. 2.

FIG. 4 is an annotated schematic diagram of the RF communication system 50 of FIG. 2. The RF communication system 50 has been annotated to show that in certain implementations the leakage detection signal from the LO leakage observation RFFE 15 detects not only LO leakage from the transmit LO 21, but also LO leakage from the observation LO 41.

In certain implementations, an observation LO and a transmitter LO oscillate at about the same frequency. In such implementations, observation LO leakage and transmitter LO leakage occur at substantially identical frequencies, thereby causing an error in observed transmitter LO leakage.

Although different LO frequencies can be used for an RF transmitter and an observation receiver, a number of available frequency synthesizers may constrain the transmitter LO and the observation LO to operate at the same frequency.

In certain implementations, an error in observed transmitter LO leakage arising from observation LO leakage is compensated for. For instance, measurements of LO leakage using both non-inverted and inverted configurations of an observation RFFE can be obtained and subtracted.

For example, a non-inverted LO leakage measurement can observe $LOL_{TX}+LOL_{RX}$, while an inverted LO leakage measurement can observe $-LOL_{TX}+LOL_{RX}$, where $LOL_{TX}$ is the transmitter LO leakage and $LOL_{RX}$ is the observation receiver LO leakage. Thus, subtracting the non-inverted and inverted measurements yields a combined measurement of about $2*LOL_{TX}$.

In one example, when measuring transmitter common mode LO leakage using the RFFE 15, a first measurement in the observation mode shown in FIG. 3A can be made and a second measurement in the observation mode shown in FIG. 3B can be made, and the measurements can be subtracted (for instance, digitally subtracted using the common mode LO leakage control circuit 3). In another example, when measuring transmitter differential LO leakage using the RFFE 15, a first measurement in the configuration shown in FIG. 3C can be made and a second measurement in the configuration shown in FIG. 3D can be made, and the measurements can be subtracted.

Although various examples of compensating for measurement error arising from observation LO leakage have been described, other implementations of observation LO leakage compensation are possible.

In another embodiment, the amplification circuit 36 of the RFFE 15 includes variable (for instance, tunable and/or programmable gain). Additionally, a first measurement is taken at a first gain (Gain1) and a second measurement is taken at a second gain (Gain2). Additionally, making a measurement in each gain mode and subtracting the measurements yields a total measurement of about Gain1*$LOL_{TX}$+$LOL_{RX}$−(Gain2*$LOL_{TX}$+$LOL_{RX}$)=(Gain1−Gain2)*$LOL_{TX}$. Thus, the result is substantially proportional to $LOL_{TX}$, and thus calibration can be performed without measurement error arising from $LOL_{RX}$. In one implementation, a gain of the amplification circuit of the RFFE is controlled using a switch (for instance, a gain of one when closed and a gain of zero when opened).

Figure 5:
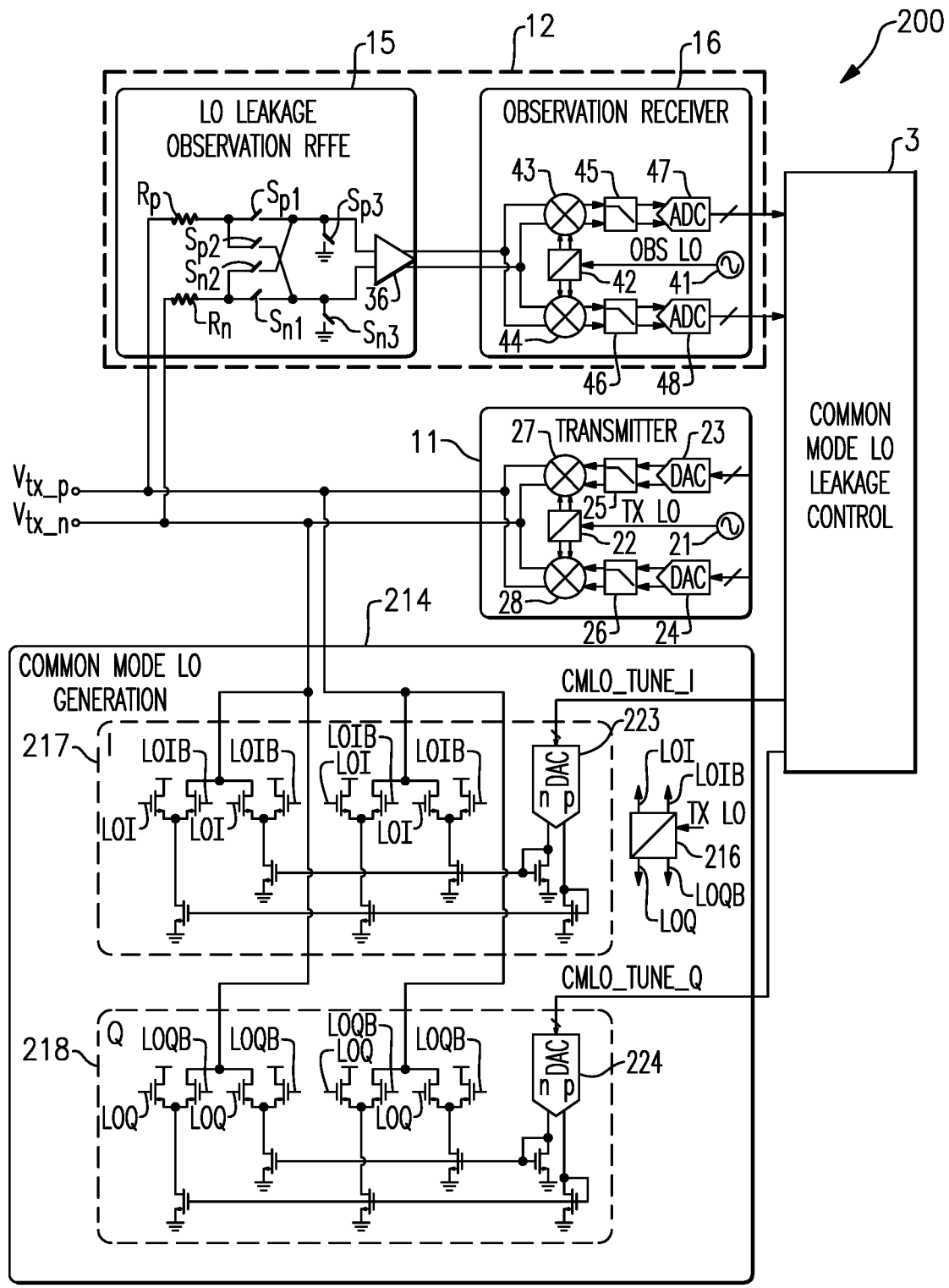
FIG. 5 is a schematic diagram of another embodiment of an RF communication system.

FIG. 5 is a schematic diagram of another embodiment of an RF communication system 200. The RF communication system 200 includes an RF transmitter 11, an LO leakage observation circuit 12, a common mode LO leakage control circuit 3, and a common mode LO generation circuit 214.

The RF communication system 200 of FIG. 5 is similar to the RF communication system 50 of FIG. 2, except that the RF communication system 200 includes a different implementation of a common mode LO generation circuit 214.

For example, the common mode LO generation circuit 214 of the illustrated embodiment includes a quadrature clock signal generator 216, an I compensation circuit 217, and a Q compensation circuit 218. The I compensation circuit 217 includes a first DAC 223 and a first plurality of transistors arranged as a doubly-balanced current-commutating mixer. Additionally, the Q compensation circuit 218 includes a second DAC 224 and a second plurality of transistors arranged as a double-balanced current-commutating mixer. As shown in FIG. 5, each doubly-balanced current-commutating mixer includes a pair of Gilbert Cells.

With continuing reference to FIG. 5, only one side of each Gilbert cell is connected to the output of the RF transmitter 11. Additionally, in the illustrated implementation, the other side of each Gilbert cell is connected to a supply voltage, and thus is unused. Furthermore, the quadrature clock signal generator 216 receives the transmit local oscillator signal (TX LO), and generates quadrature clock signals for the doubly-balanced current-commutating mixers.

The common mode LO generation circuit 214 generates a common mode LO signal that is combined with the transmitter output signal. For example, the doubly-balanced current-commutating mixers are implemented to provide about the same mixer output phase for both the non-inverted voltage output $V_{tx\_p}$ and the inverted voltage output $V_{tx\_n}$, and thus serve to generate a common mode LO signal.

As shown in FIG. 5, the common mode LO leakage control circuit 3 controls the values of a first digital control signal CMLO_TUNE_I provided to the first DAC 223 and of a second digital control signal CMLO_TUNE_Q provided to the second DAC 224. The DACs 223, 224 in turn control biasing of the doubly-balanced current-commutating mixers, in this embodiment. By controlling the values of the digital control signals, the common mode LO leakage control circuit 3 controls the magnitude of the common mode LO signal, and thus the amount of common mode LO leakage compensation provided.

In certain implementations, the common mode LO leakage control circuit 3 controls a value of the first digital control signal CMLO_TUNE_I to compensate for common mode LO leakage arising from the I-path mixer 27 of the RF transmitter 11, and a value of the second digital control signal CMLO_TUNE_Q to compensate for common mode LO leakage arising from the Q-path mixer 28 of the RF transmitter 11.

Although one embodiment of a common mode LO generation circuit is shown in FIG. 5, the teachings herein are applicable to common mode LO generation circuits implemented in a wide variety of ways.

Figure 6:
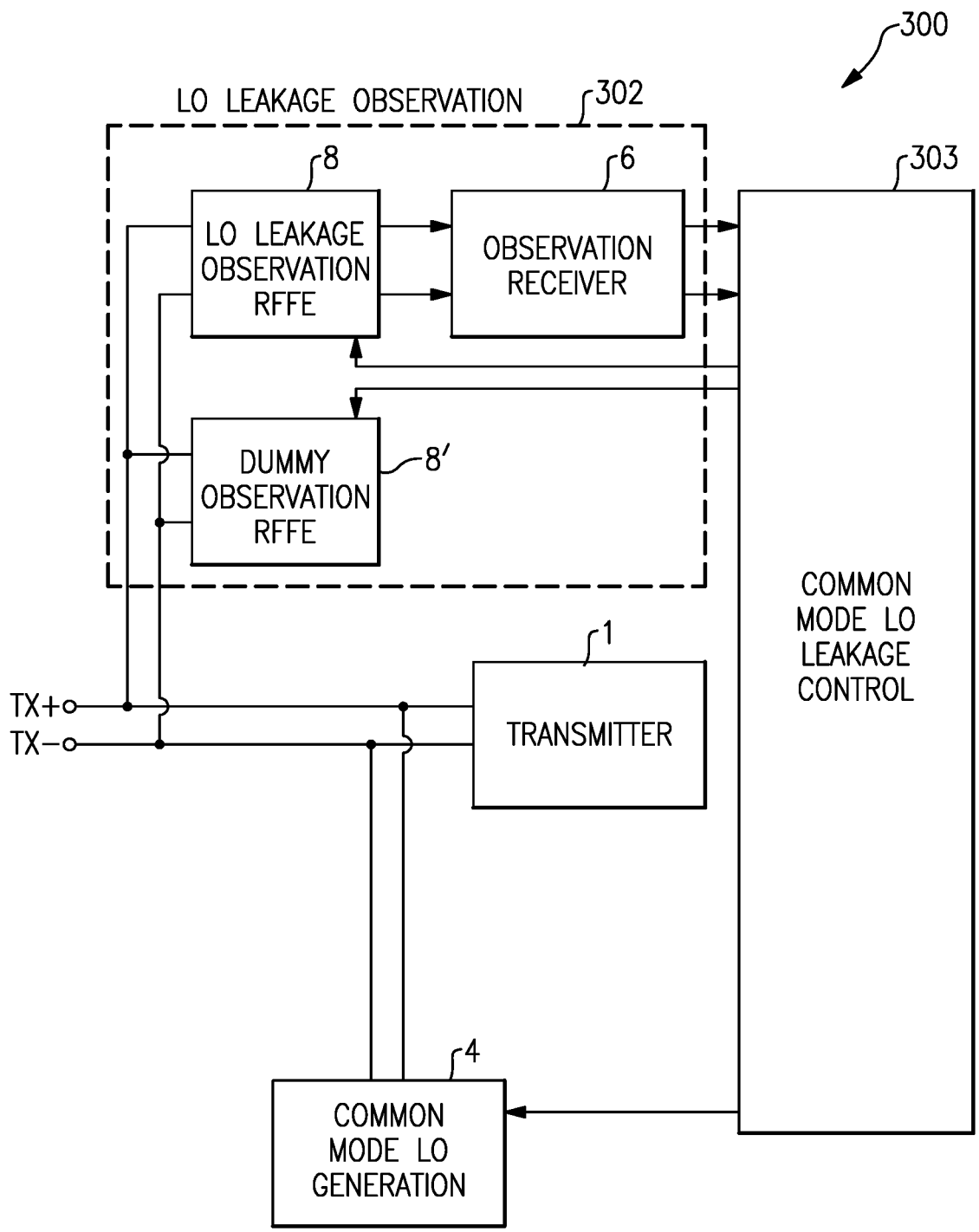
FIG. 6 is a schematic diagram of another embodiment of an RF communication system.

FIG. 6 is a schematic diagram of another embodiment of an RF communication system 300. The RF communication system 300 includes an RF transmitter 1, an LO leakage observation circuit 302, a common mode LO leakage control circuit 303, and a common mode LO generation circuit 4. The LO leakage observation circuit 302 includes a multi-mode LO leakage observation RFFE 8, a multi-mode dummy observation RFFE 8', and an observation receiver 6.

The RF communication system 300 of FIG. 6 is similar to the RF communication system 10 of FIG. 1, except that the RF communication system 300 of FIG. 6 is implemented with the dummy observation RFFE 8' to reduce or eliminate changes in input impedance of the LO leakage observation circuit 302 as the observation mode of the LO leakage observation RFFE 8 is changed.

For example, certain LO leakage observation RFFEs, such as the multi-mode LO leakage observation RFFE 8, are configurable to detect either common mode LO leakage or differential LO leakage. By using configurable circuitry to observe both common mode and differential LO leakage, a shared LO leakage observation path can be used to measure a totality of a transmitter's LO leakage.

Although using an LO leakage observation circuit for detecting both common mode LO leakage and differential LO leakage provides a number of advantages, changing the observation mode of an LO leakage observation circuit can result in a change of the input impedance. Absent compensation, the change in input impedance can lead to an impact in transmit power control and/or undesired emissions.

In the illustrated embodiment, the LO leakage observation circuit 302 includes not only a configurable LO leakage observation RFFE 8, but also a dummy observation RFFE 8'. Additionally, the output of the LO leakage observation RFFE 8 is provided to the observation receiver 6, and the output of the dummy observation RFFE 8' is unused, in this embodiment. Furthermore, the common mode LO leakage control circuit 303 controls the LO leakage observation RFFE 8 and the dummy observation RFFE 8' to complementary measurement configurations or observation modes to inhibit variations in loading of the RF transmitter 1.

For example, when the common mode LO leakage control circuit 303 controls the LO leakage observation RFFE 8 to observe common mode LO leakage, the common mode LO leakage control circuit 303 controls the dummy observation RFFE 8' to observe differential LO leakage. Additionally, when the common mode LO leakage control circuit 303 controls the LO leakage observation RFFE 8 to observe differential LO leakage, the common mode LO leakage control circuit 303 controls the dummy observation RFFE 8' to observe common mode LO leakage.

Figure 7:
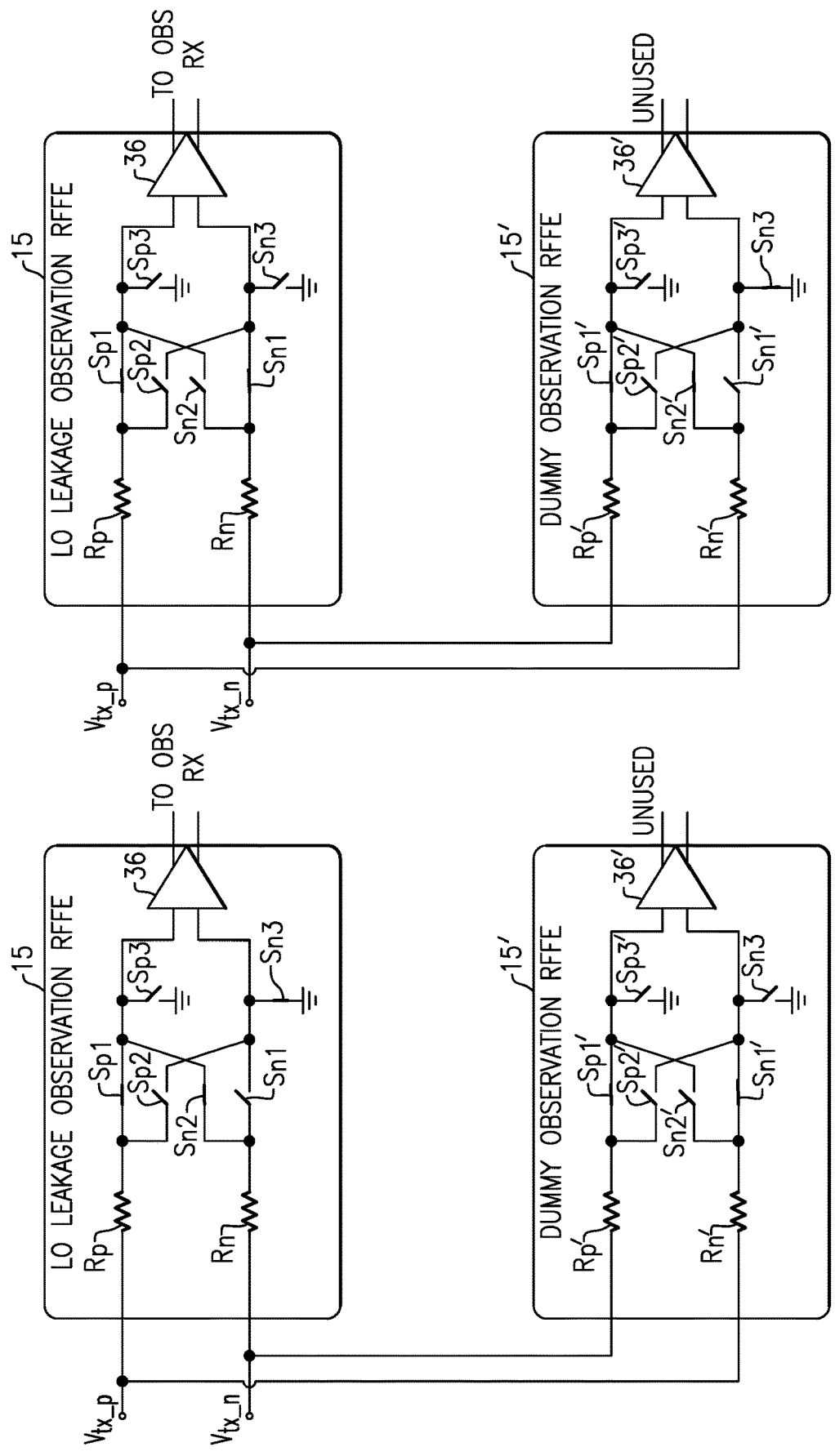
FIG. 7A illustrates one example of observation modes for an LO leakage observation RFFE and a dummy observation RFFE according to one embodiment.
FIG. 7B illustrates another example of observation modes for an LO leakage observation RFFE and a dummy observation RFFE according to one embodiment.

FIGS. 7A and 7B illustrate various examples of observation modes for an LO leakage observation RFFE 15 and a dummy observation RFFE 15' according to one embodiment. The LO leakage observation RFFE 15 includes a resistor $R_p$, a resistor $R_n$, a switch $S_{p1}$, a switch $S_{p2}$, a switch $S_{p3}$, a switch $S_{n1}$, a switch $S_{n2}$, a switch $S_{n3}$, and an amplification circuit 36. The dummy observation RFFE 15' includes a resistor $R_p'$, a resistor $R_n'$, a switch $S_{p1}'$, a switch $S_{p2}'$, a switch $S_{p3}'$, a switch $S_{n1}'$, a switch $S_{n2}'$, a switch $S_{n3}'$, and an amplification circuit 36'. In certain implementations, the dummy observation RFFE 15' is a replica of the LO leakage observation RFFE 15.

As shown in FIGS. 7A and 7B, the LO leakage observation RFFE 15 and the dummy observation RFFE 15' are each electrically connected to the non-inverted voltage output $V_{tx\_p}$ and the inverted voltage output $V_{tx\_n}$. Additionally, the LO leakage observation RFFE 15 and the dummy observation RFFE 15' are controlled to complementary measurement configurations or observation modes to inhibit variations in loading to the non-inverted voltage output $V_{tx\_p}$ and the inverted voltage output $V_{tx\_n}$.

FIG. 7A illustrates one example of observation modes for the LO leakage observation RFFE 15 and the dummy observation RFFE 15'. In the example shown in FIG. 7A, the switches of the LO leakage observation RFFE 15 are controlled to the common mode LO leakage (non-inverted) observation mode set forth in Table 1. Additionally, the dummy observation RFFE 15' is controlled to the differential LO leakage (non-inverted) observation mode set forth in Table 1.

FIG. 7B illustrates another example of observation modes for the LO leakage observation RFFE 15 and the dummy observation RFFE 15'. In the example shown in FIG. 7B, the switches of the LO leakage observation RFFE 15 are controlled to the differential LO leakage (non-inverted) observation mode set forth in Table 1. Additionally, the dummy observation RFFE 15' is controlled to the common mode LO leakage (non-inverted) observation mode set forth in Table 1.

Thus, when one RFFE is controlled to a common mode LO leakage observation mode, the other is controlled to a differential LO leakage observation mode, and vice versa. In the illustrated embodiment, when the LO leakage observation RFFE 15 operates in to the common mode LO leakage (non-inverted) observation mode, the dummy observation RFFE 15' operates in the differential LO leakage (non-inverted) observation mode, and vice versa. However, other selections of complementary observation modes are possible. In another example, when the LO leakage observation RFFE 15 operates in to the common mode LO leakage (non-inverted) observation mode, the dummy observation RFFE 15' operates in the differential LO leakage (inverted) observation mode.

Controlling the RFFEs to complementary observation modes reduces or eliminates difference in loading of an RF transmitter as the observation mode is changed. For example, when controlling the RFFEs in this manner a total input impedance of the LO leakage observation circuit is substantially constant for different observation modes.

For example, with reference back to FIGS. 3A-3D, when the RFFE 15 is configured to observe common mode LO leakage (FIGS. 3A and 3B), the input impedance of the RFFE 15 is about equal to sum of the resistances of resistor $R_p$ and resistor $R_n$. However, when the RFFE 15 is configured to observe differential LO leakage (FIGS. 3C and 3D), the RFFE's input impedance is very high since the amplification circuit 36 has high input impedance.

Absent compensation, a change in input impedance of an RFFE can disturb the RF transmitter's output power when the observation mode is changed, which in turn may lead to an impact in transmit power control and/or undesired emissions.

Although the resistance of the resistor $R_p$ and resistor $R_n$ can be selected to relatively high to match an input impedance of the amplification circuit 36, implementing the resistor $R_p$ and resistor $R_n$ with high resistances can also undesirably degrade noise performance, for instance, by increasing input referred noise.

In contrast, including the dummy observation RFFE 15' provides input impedance matching across mode without undesirably degrading noise performance.

Thus, in implementations using both an LO leakage observation RFFE and a dummy observation RFFE, the output of an RF transmitter is loaded by one RFFE in a differential observation mode and another RFFE in a common mode observation mode. Thus, any change of input impedance across mode is relatively small, for instance, a difference in matching of impedances between the dummy observation RFFE 15' and the LO leakage observation RFFE 15.

Figure 8:
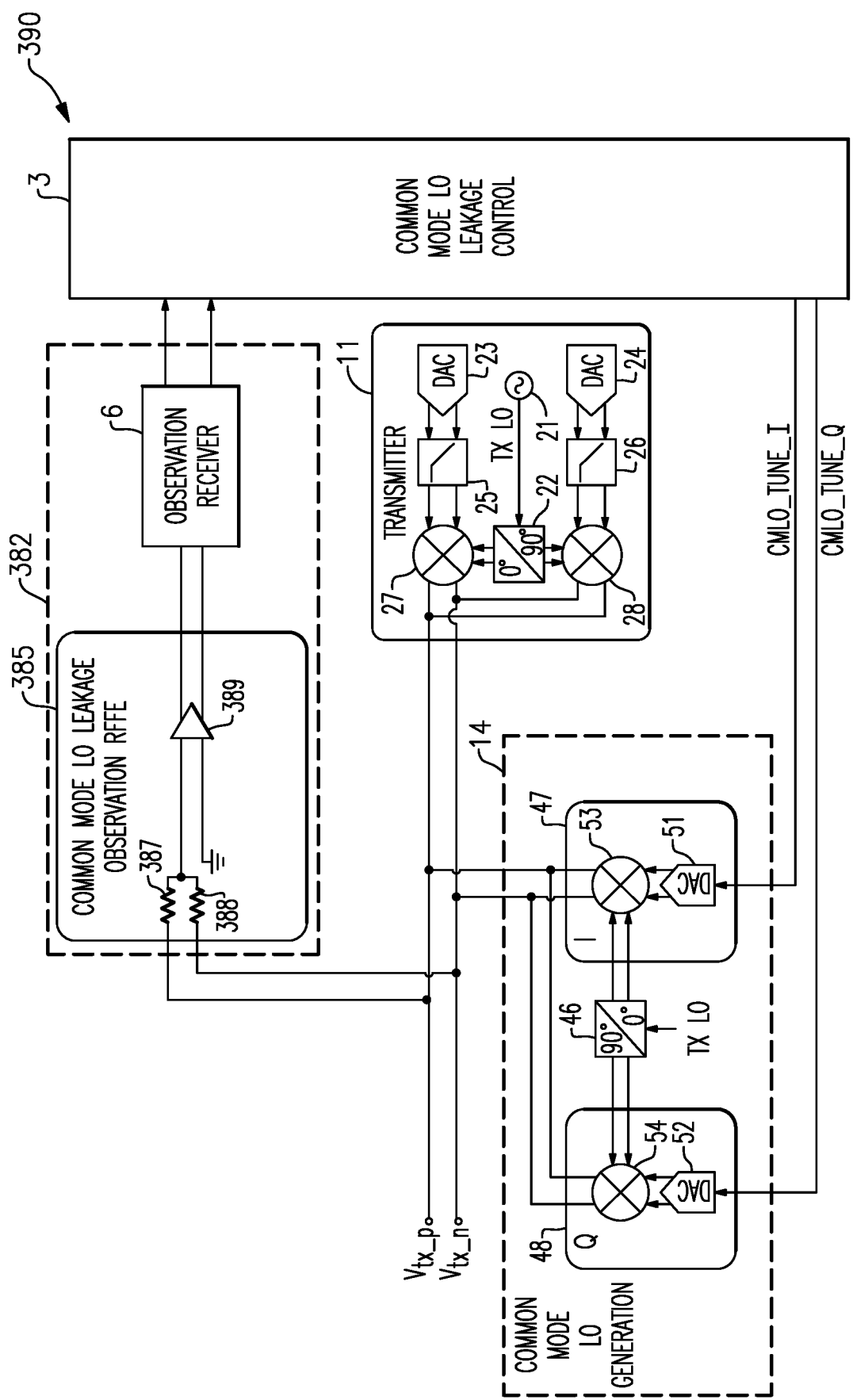
FIG. 8 is a schematic diagram of another embodiment of an RF communication system.

FIG. 8 is a schematic diagram of another embodiment of an RF communication system 390. The RF communication system 390 includes an RF transmitter 11, an LO leakage observation circuit 382, a common mode LO leakage control circuit 3, and a common mode LO generation circuit 14.

The RF communication system 390 of FIG. 8 is similar to the RF communication system 50 of FIG. 2, except that the RF communication system 390 of FIG. 8 includes a different implementation of an LO leakage observation circuit.

For example, the LO leakage observation circuit 382 of FIG. 8 includes a common mode LO leakage observation RFFE 385 and an observation receiver 6. In the illustrated embodiment, the common mode LO leakage observation RFFE 385 includes a first resistor 387, a second resistor 388, and an amplification circuit 389. In contrast to the LO leakage observation RFFE 15 of FIG. 2, the common mode LO leakage observation RFFE 385 of FIG. 8 omits switches for configuring the RFFE between a common mode observation mode and a differential observation mode. Thus, the common mode LO leakage observation RFFE 385 of FIG. 8 measures common mode LO leakage, but not differential LO leakage.

Figure 9:
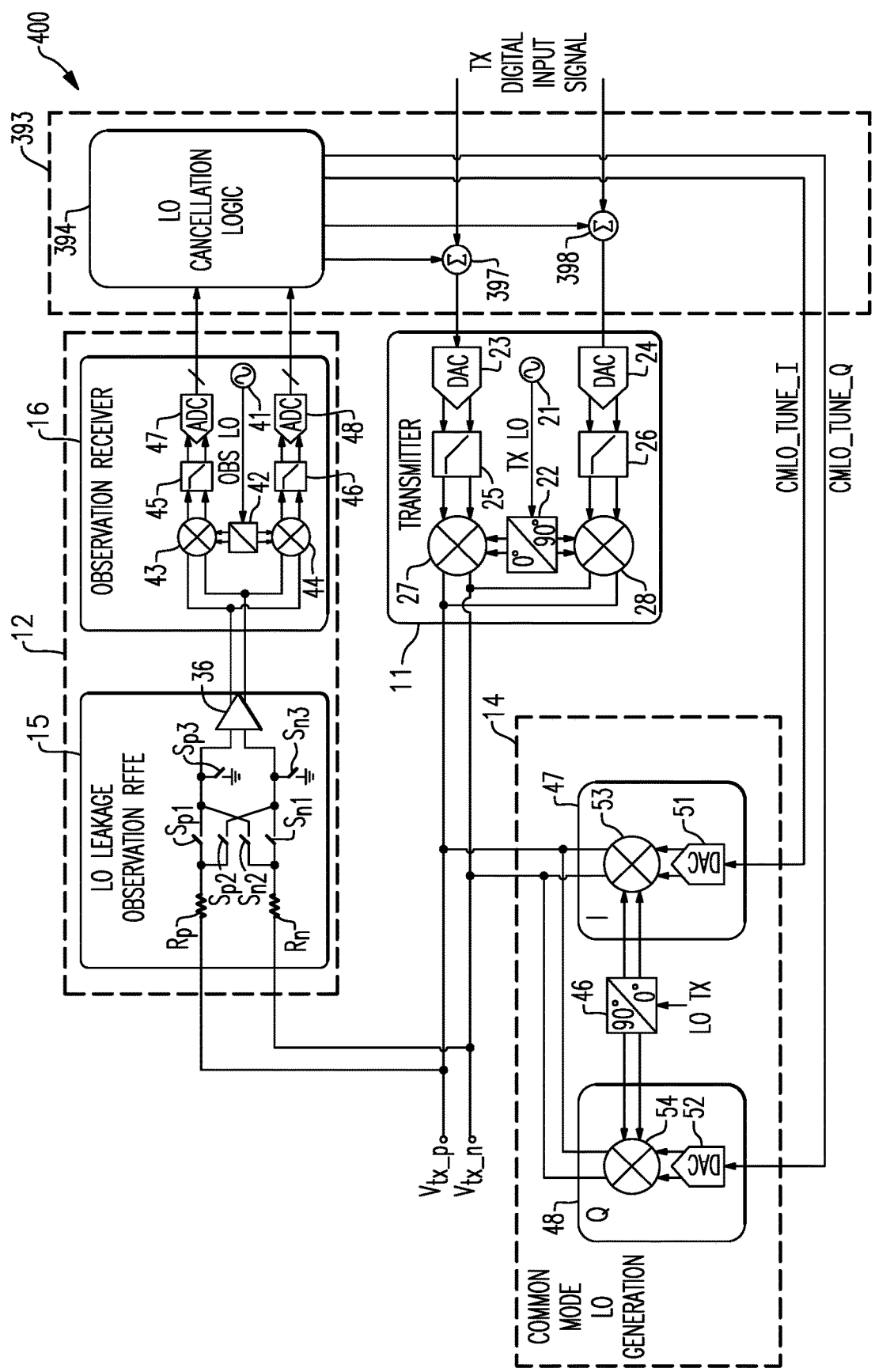
FIG. 9 is a schematic diagram of another embodiment of an RF communication system.

FIG. 9 is a schematic diagram of another embodiment of an RF communication system 400. The RF communication system 400 includes an RF transmitter 11, an LO leakage observation circuit 12, a common mode LO leakage control circuit 393, and a common mode LO generation circuit 14.

In the illustrated embodiment, the common mode LO leakage control circuit 393 includes LO cancellation logic 394, a first digital adder 397 in a baseband I-path of the RF transmitter 11, and a second digital adder 398 in a baseband Q-path of the RF transmitter 11.

The illustrated common mode LO leakage control circuit 393 can be used to control an amount of compensation for both common mode LO leakage and differential LO leakage.

For example, the digital control signals CMLO_TUNE_I and CMLO_TUNE_Q control an amount of common mode leakage correction provided by the common mode LO generation circuit 14. Additionally, an amount of DC offset added to the transmitter's digital input signal controls an amount of differential LO leakage correction. Thus, the LO cancellation logic circuit 394 controls the values provided to the DACs 51, 52 and to the digital adders 397, 398 to control compensation of both common mode LO leakage and differential LO leakage.

Figure 10A:
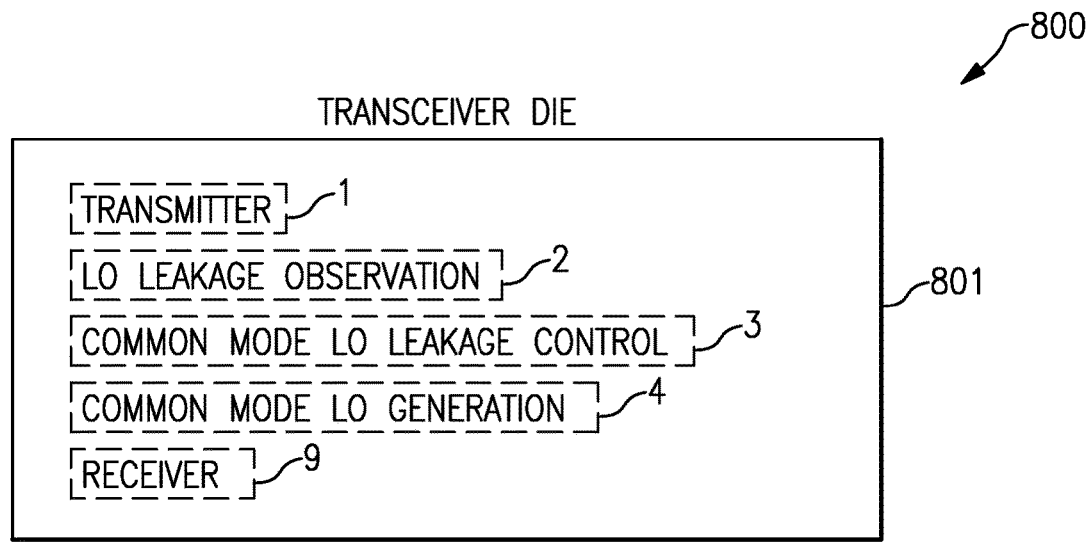
FIG. 10A is a schematic diagram of a transceiver die according to one embodiment.

FIG. 10A is a schematic diagram of a transceiver die 800 according to one embodiment. The transceiver die 800 includes a semiconductor substrate 801 on which a transmitter 1, an LO leakage observation circuit 2, a common mode LO leakage control circuit 3, a common mode LO generation circuit 4, and a receiver 9 have been fabricated or formed.

Figure 10B:
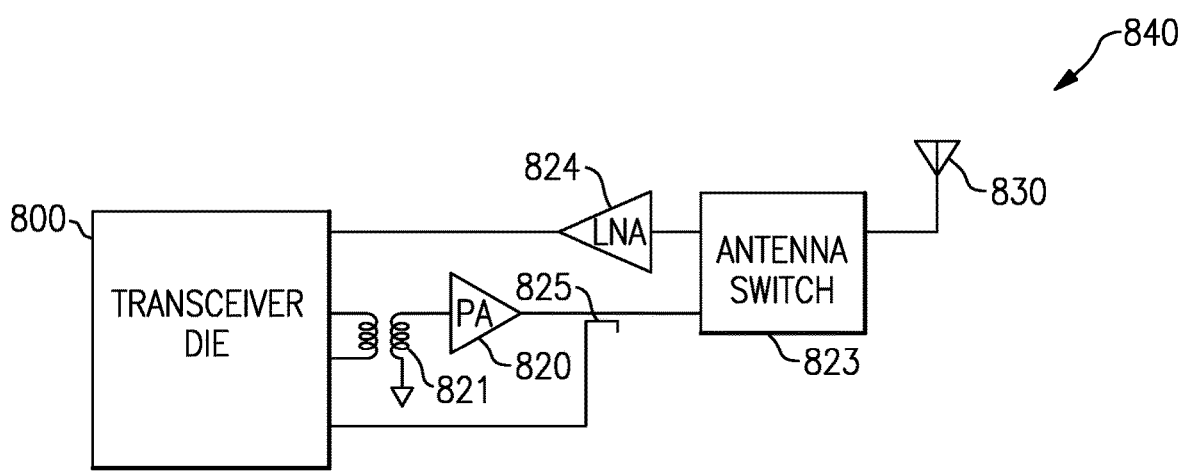
FIG. 10B is a schematic diagram of an RF communication system according to another embodiment.

FIG. 10B is a schematic diagram of an RF communication system 840 according to another embodiment. The RF communication system 840 includes a transceiver die 800, a power amplifier 820, a balun 821, an antenna switch 823, a low noise amplifier 824, a directional coupler 825, and an antenna 830.

The illustrated transceiver die 800 generates a differential transmit signal, which is provided to an input of the balun 821. The balun converts the differential transmit signal to a single-end transmit signal suitable for amplification by the power amplifier 820. The power amplifier 820 generates an amplified radio frequency signal, which is provided to the antenna 830 via the antenna switch 823.

As shown in FIG. 10B, a directional coupler 825 is provided at the output of the power amplifier 820. Including the directional coupler 825 aids in sensing a transmit power level of the power amplifier 820. In certain implementations, the sensed power level is provided to an observation receiver of the transceiver die 800. In one embodiment, an observation receiver used in an LO leakage observation circuit is also used for sensing a power amplifier's power level.

Sensing the power amplifier's power level provides a number of advantages. In one example, the sensed power level is used for digital predistortion (DPD), which aids in linearizing the power amplifier 820 for different input power levels. For example, DPD can refer to processing of a signal in the digital domain before the signal is converted to analog, upconverted to radio frequency, and amplified by a power amplifier. DPD can be used to compensate for non-linear effects of the power amplifier, including, for example, signal constellation distortion and/or signal spectrum spreading. DPD can not only improve the linearity of the power amplifier, but can also reduce power dissipation and/or enhance transmit spectral purity.

The antenna switch 823 is used to electrically couple the antenna 830 to the power amplifier 820 and to the low noise amplifier 824. The antenna switch 823 can provide not only switching functionality, but also duplexing and/or filtering of signals.

The low noise amplifier 824 is used to amplify a received signal from the antenna 830, and to provide the amplified receive signal to a receiver of the transceiver die 800.

Although FIGS. 10A and 10B illustrate one embodiment of a transceiver die and one embodiment of an RF communication system that includes a transceiver die, other implementations are possible. For example, transmitters with common mode local oscillator leakage compensation can be used in RF electronics implemented in a wide variety of ways.

Applications

Devices employing the above described schemes can be implemented into various electronic devices. Examples of electronic devices include, but are not limited to, consumer electronic products, parts of the consumer electronic products, electronic test equipment, communication infrastructure, etc. For instance, transmitter with common mode LO leakage compensation can be used in a wide range of RF systems, including, but not limited to, base stations, mobile devices (for instance, smartphones or handsets), laptop computers, tablets, and wearable electronics. The teachings herein are applicable to RF systems operating over a wide range of frequencies and bands, including those using time division duplexing (TDD) and/or frequency division duplexing (FDD). A wide range of consumer electronics products can also include a transceiver for Internet of Things (IOT) applications and/or to provide the product with wireless connectivity. For instance, a transceiver with common mode LO leakage compensation can be included in an automobile, a camcorder, a camera, a digital camera, a portable memory chip, a washer, a dryer, a washer/dryer, a copier, a facsimile machine, a scanner, a multi-functional peripheral device, or a wide range of other consumer electronics products. Furthermore, electronic devices can include unfinished products, including those for industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) communication system with common mode local oscillator leakage compensation, the RF communication system comprising:
    an RF transmitter comprising a local oscillator (LO), the RF transmitter configured to generate a differential transmitter signal including a non-inverted signal and an inverted signal;
    an LO leakage observation circuit configured to determine an amount of common mode LO leakage from the LO in the differential transmitter signal based at least in part on a sum of the non-inverted signal the inverted signal; and
    a common mode LO generation circuit configured to compensate the RF transmitter for the amount of common mode LO leakage determined by the LO leakage observation circuit.

2. The RF communication system of claim 1, wherein the common mode LO generation circuit is configured to generate a common mode LO signal that is combined with the differential transmitter signal to compensate for the amount of common mode LO leakage.

3. The RF communication system of claim 1, wherein the RF transmitter comprises a zero-intermediate frequency transmitter.

4. The RF communication system of claim 1, wherein the RF communication system further comprises a common mode LO leakage control circuit configured to control an amount of leakage correction provided by the common mode LO generation circuit based on the amount of common mode LO leakage.

5. The RF communication system of claim 1, wherein the LO leakage observation circuit is further configured to determine a differential LO leakage from the LO based at least in part on a difference between the non-inverted signal and the inverted signal.

6. The RF communication system of claim 1, wherein the LO leakage observation circuit comprises an observation radio frequency front end (RFFE) configured to generate a leakage observation signal based on the differential transmitter signal, and an observation receiver configured to downconvert the leakage observation signal.

7. The RF communication system of claim 1, wherein the common mode LO generation circuit comprises an in-phase (I) mixer and a quadrature-phase (Q) mixer configured to generate a common mode LO signal that is combined with the differential transmitter signal.

8. The RF communication system of claim 5, wherein the LO leakage observation circuit is configurable between a common mode leakage observation mode and a differential leakage observation mode.

9. The RF communication system of claim 6, wherein the RF communication system further comprises a common mode LO leakage control circuit configured to receive one or more digital observation signals from the observation receiver, and to control an amount of leakage correction provided by the common mode LO generation circuit based on the one or more digital observation signals.

10. The RF communication system of claim 6, wherein the observation RFFE is configurable between a common mode leakage observation mode and a differential leakage observation mode.

11. The RF communication system of claim 7, wherein the common mode LO generation circuit further comprises a first digital-to-analog converter (DAC) configured to control an amount of common mode leakage compensation provided by the I mixer based on a first digital control signal, and a second DAC configured to control an amount of common mode leakage compensation provided by the Q mixer based on a second digital control signal.

12. The RF communication system of claim 9, wherein the LO leakage observation circuit further comprises a dummy RFFE in parallel with the observation RFFE, wherein the dummy RFFE is controlled to the differential leakage observation mode when the observation RFFE is in the common mode leakage observation mode, and to the common mode leakage observation mode when the observation RFFE is in the differential leakage observation mode.

13. The RF communication system of claim 9, wherein the observation receiver comprises an observation LO, wherein the amount of common mode LO leakage is compensated for measurement error arising from LO leakage from the observation LO.

14. The RF communication system of claim 13, wherein the amount of common mode LO leakage is compensated using at least one of a plurality of LO leakage observation measurements with different measurement polarities or a plurality of LO leakage observation measurements with different gains.

15. A method of compensating for transmitter common mode local oscillator leakage in a radio frequency (RF) communication system, the method comprising:
generating a differential transmitter signal by using at least a local oscillator (LO) of an RF transmitter, wherein the differential transmitter signal includes a non-inverted signal and an inverted signal;
determining, using an LO leakage observation circuit, an amount of common mode LO leakage from the LO based at least in part on a sum of the non-inverted signal and the inverted signal; and
compensating the RF transmitter for common mode LO leakage based on the determined amount of common mode LO leakage using a common mode LO generation circuit.

16. The method of claim 15, wherein compensating the RF transmitter for common mode LO leakage comprises generating a common mode LO signal, controlling a magnitude of the common mode LO signal based on the determined amount of common mode LO leakage, and combining the common mode LO signal with the differential transmitter signal.

17. A transceiver die with common mode local oscillator leakage compensation, the transceiver die comprising:
a semiconductor substrate;
a radio frequency (RF) transmitter formed on the semiconductor substrate and comprising a local oscillator (LO), wherein the RF transmitter is configured to generate a differential transmitter signal that includes a non-inverted signal and an inverted signal by using at least the LO and a mixer;
an LO leakage observation circuit formed on the semiconductor substrate and configured to determine, based at least in part on a sum of the non-inverted signal and the inverted signal, an amount of common mode LO leakage from the LO into an output of the RF transmitter; and
a common mode LO generation circuit formed on the semiconductor substrate and configured to compensate the RF transmitter for the amount of common mode LO leakage determined by the LO leakage observation circuit.

18. The transceiver die of claim 17, wherein the common mode LO generation circuit is configured to generate a common mode LO signal that is combined with the differential transmitter signal to compensate for the common mode LO leakage.

19. The transceiver die of claim 17, further comprising a common mode LO leakage control circuit formed on the semiconductor substrate and configured to control an amount of leakage correction provided by the common mode LO generation circuit based on the amount of common mode LO leakage.

20. The transceiver die of claim 17, wherein the LO leakage observation circuit comprises an observation radio frequency front end (RFFE) configured to generate a leakage observation signal based at least in part on the sum, and an observation receiver configured to downconvert the leakage observation signal.

\* \* \* \* \*

UNITED STATES PATENT AND TRADEMARK OFFICE
CERTIFICATE OF CORRECTION

PATENT NO. : 11,012,104 B2  
APPLICATION NO. : 15/478926  
DATED : May 18, 2021  
INVENTOR(S) : David J. McLaurin It is certified that error appears in the above-identified patent and that said Letters Patent is hereby corrected as shown below:

In the Specification

In Column 8, Line 5, delete "$V_{tx\_p}$" and insert --$V_{tx\_n}$--.

In the Claims

In Column 14, Line 48, Claim 1, after "signal" insert --and--.

Signed and Sealed this  
Twentieth Day of July, 2021

Drew Hirshfeld  
*Performing the Functions and Duties of the  
Under Secretary of Commerce for Intellectual Property and  
Director of the United States Patent and Trademark Office*